Figure 1:
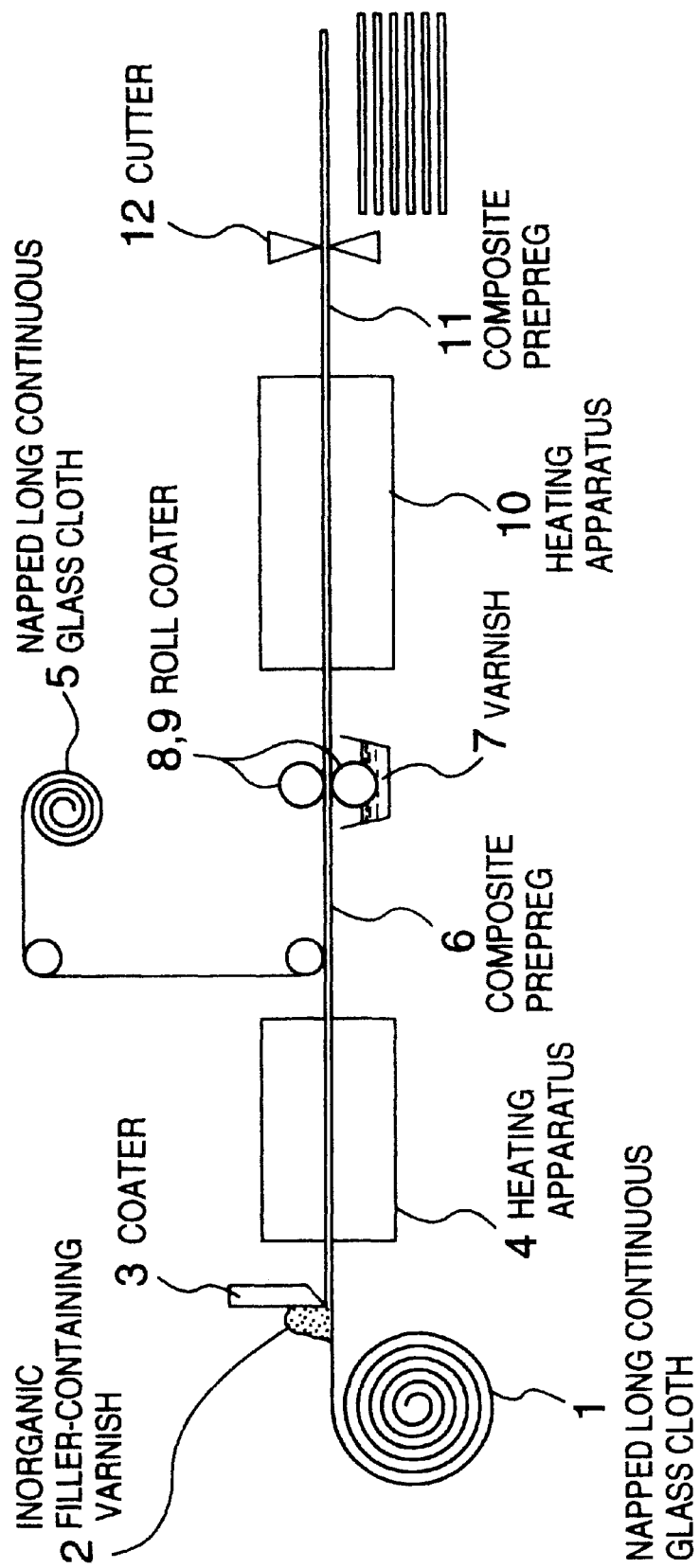

United States Patent

Nakata

Patent Number: 6,117,516
Date of Patent: Sep. 12, 2000

[54] LAMINATE AND PROCESS FOR PRODUCING THE SAME

[75] Inventor: Takahiro Nakata, Fujieda, Japan

[73] Assignee: Sumitomo Bakelite Company Limited, Tokyo, Japan

[21] Appl. No.: 09/057,975

[22] Filed: Apr. 10, 1998

[30] Foreign Application Priority Data

| | | | |
|---|---|---|---|
| Apr. 24, 1997 | [JP] | Japan | 9-107906 |
| Apr. 25, 1997 | [JP] | Japan | 9-109818 |
| Apr. 25, 1997 | [JP] | Japan | 9-109819 |
| Jun. 9, 1997 | [JP] | Japan | 9-150964 |

[51] Int. Cl.$^7$ ............... B32B 3/02; B05D 3/02
[52] U.S. Cl. ............... 428/96; 428/86; 428/91; 427/386; 427/389.8
[58] Field of Search ............... 428/86, 91, 96; 427/372.2, 386, 389.8

[56] References Cited

U.S. PATENT DOCUMENTS

| | | | |
|---|---|---|---|
| 5,466,505 | 11/1995 | Fukuda et al. | 428/91 |
| 5,677,045 | 10/1997 | Nagai et al. | 174/148 |

FOREIGN PATENT DOCUMENTS

| | | |
|---|---|---|
| 0 193 078 | 9/1986 | European Pat. Off. . |
| 05138791 | 6/1993 | Japan . |
| 08041224 | 2/1996 | Japan . |
| 8-174736 | 7/1996 | Japan . |
| 08267664 | 10/1996 | Japan . |
| 9-254331 | 9/1997 | Japan . |

OTHER PUBLICATIONS

Database WPI, 96–3366998, Class A85, JP0817436A (Suitomo Bakelite Co., Ltd.) Jul. 9, 1996.
Patent Abstract of Japan, vol. 096, No. 011, JP 08 174769 A (Hitachi Chem. Co., Ltd.) Jul. 9, 1996.
Derwent Abstract Accession No. 96–157176/16, Class A85, L03, JP08041224–A (Matsushita Electric Works) Feb. 13, 1996.
Derwent Abstract Accession No. 93–216218/27, Class A85, L03, JP05138791–A (Sumitomo Bakelite) Jun. 8, 1993.
Derwent Abstract Accession No. 88–067850/10, Class P73, JP63021969–A (UNITIKA) Jan. 29, 1988.
Derwent Abstract Accession No. 96–513885/51, Class A32, L03, JP08267664–A (Sumitomo Bakelite) Oct. 15, 1996.
Derwent Abstract Accession No. 89–188797/26, Class P73, JP01127335–A (Sumitomo Bakelite) May 19, 1989.

*Primary Examiner*—Blaine Copenheaver
*Assistant Examiner*—Ula C. Ruddock
*Attorney, Agent, or Firm*—Smith Gambrell & Russell, LLP

[57] ABSTRACT

This invention provides a laminate, both surface layers of which are each composed of a base material consisting of a glass cloth napped at least on its inner surface side and impregnated with a thermosetting resin, and the intermediate layer of which laminate is composed of a composition comprising a thermosetting resin mixed with an inorganic filler in a proportion of 10 to 300% by weight based on the weight of the resin, the surface layers and the intermediate layer having been integrated by heating and pressing. This laminate can be produced by a process comprising a step of coating napped surface of a long continuous glass cloth napped on one or both sides with a thermosetting resin containing an inorganic filler and heating the same, a step of piling a glass cloth napped on one or both sides on the above resin-coated surface so that the napped surface of the napped glass cloth faces the resin-coated surface to prepare a composite prepreg, and a step of integrating the composite prepreg by heating and pressing.

9 Claims, 1 Drawing Sheet

LAMINATE AND PROCESS FOR PRODUCING THE SAME

This invention relates to a laminate for a printed circuit which is used particularly in electric equipment, electronic equipment, communication equipment and the like.

Printed circuit boards have been strongly required to be small in size and high in function because electric equipments have become light, thin and small. In particular, in the case of laminates for multilayer circuit boards, glass epoxy resin copper-clad laminates, and CEM 3 (Composite Epoxy Material Grade-3) type epoxy resin composite laminates (laminates produced by impregnating a substrate composed of a glass non-woven fabric as an intermediate layer base material and glass clothes as base materials for both surface layers with an epoxy resin and heat-pressing the impregnated substrate) which are used in printed circuit boards, it has become strongly required to enhance the thickness precision (uniformity) of the laminate.

In laminates where glass clothes are used, there has heretofore been such a problem that the peripheral portions of the laminates are made thin by such a phenomenon that a resin flows out of the edge faces of the laminates during lamination molding (this phenomenon is referred to hereinafter as the flow). Moreover, in recent years, in the case of the glass non-woven fabric-free composite laminate developed by the present inventor and others (JP-A-9-254,331), there has been such a problem that the flow is great during lamination molding because the glass non-woven fabric is not used and hence good molding is impossible. Furthermore, it has also become a severe problem to enhance the adhesion properties (interlaminar adhesion properties) between the glass cloth and the intermediate layer resin.

The present inventor has made various studies for the purposes of the improvement of moldability by diminishing the flow during lamination molding, the inhibition of generation of powders of resin or the like from prepreg and the improvement of interlaminar adhesion properties, and he has consequently obtained such knowledge that when at least one surface of a glass cloth is napped, the flow of the resin in the intermediate layer can be inhibited during the molding and the adhesion properties between the surface layer glass cloth and the resin composition of the intermediate layer are improved and that it is preferable to add an inorganic fiber to the intermediate layer to enhance the flexural strength and impact resistance, and based on this knowledge, this invention has been completed.

According to this invention, there is provided a laminate, both surface layers of which are each composed of a base material consisting of a glass cloth napped at least on its inner surface side and impregnated with a thermosetting resin, and the intermediate layer of which laminate is composed of a composition comprising a thermosetting resin mixed with an inorganic filler in a proportion of 10 to 300% by weight based on the weight of the resin, the surface layers and the intermediate layer having been integrated by heating and pressing. In said laminate, it is preferable that the nap length of the napped glass cloth used in the surface layers is 50 $\mu$m or more.

Moreover, in order to improve the flexural strength and impact resistance of the laminate, the composition of the intermediate layer comprises, as a part of the inorganic filler, an inorganic fiber mixed in a proportion of 0.01 to 50% by weight based on the weight of the thermosetting resin, and preferably, the diameter of the inorganic fiber is 15 $\mu$m or less.

In the accompanying drawing, FIG. 1 is a diagram showing an example of the process for producing a composite prepreg from which the laminate of this invention is produced by lamination molding, in which 1 refers to a napped long continuous glass cloth, 2 to an inorganic filler-containing thermosetting resin varnish, 3 to a coater, 4 to a heating apparatus, 5 to a napped long continuous glass cloth, 6 to a composite prepreg, 7 to a thermosetting resin varnish, 8 and 9 to roll coaters, 10 to a heating apparatus, 11 to a composite prepreg and 12 to a cutter.

In this invention, the glass cloth used in the surface layers is napped at least on its inner surface side, namely on the side facing the intermediate layer, in order to inhibit the flow of the resin composition in the intermediate layer during lamination molding and improve the adhesion properties between the surface layer and the intermediate layer. The nap length is not critical; however, it is preferably 50 $\mu$m or more for effectively inhibiting the flow of the resin composition during lamination molding and improving the above interlaminar adhesion properties, and more preferably 300 $\mu$m or more particularly when it is necessary to substantially completely prevent the flow. When the nap height is less than 300 $\mu$m, it is impossible to substantially completely prevent the flow by the napped fibers. When the nap length is less than 50 $\mu$m, the flow of the resin composition is caused during lamination molding, and the thickness of the laminate is greatly varied in some cases.

The nap length is limited by the napping method, and the maximum is about 1,500 $\mu$m. Usually, a nap length of 300 $\mu$m or more has a substantially satisfactory effect on the prevention of the flow, although the effect depends on the thickness of a laminate and the fluidity of a resin composition in the intermediate layer. By increasing the nap length to more than about 1,000 $\mu$m, the effect on the prevention of the flow is not increased, so that it is not necessary to increase the nap length any more. The method for napping the surface of a glass cloth includes a loop raising method, methods using needle punch, brush, emery, raising fillets and the like, a method using water jet and the like, and any method may be used. The glass cloth may be any one, and preferably has a basis weight of 20 to 300 g/m$^2$. When the basis weight exceeds 300 g/m$^2$, the processability by a drill or the like becomes inferior, and when it is less than 20 g/m$^2$, the strength becomes low and the napping treatment becomes difficult.

In the laminate of this invention, the weight ratio of the total amount of the thermosetting resin and the inorganic filler to the amount of the napped glass cloth is preferably 0.2 to 10.0. In this range, the napped glass cloth has an effect of preventing the flow of the inorganic filler-containing thermosetting resin composition and the characteristics of the laminate become at least equivalent to those of a conventional one. When the weight ratio is less than 2.0, the features as a composite laminate, that is, good processability, low cost and the like, are not satisfied, and when it exceeds 10.0, the glass cloth portion becomes small and the mechanical characteristics including strength and the like are deteriorated. The weight ratio is preferably 2.5 to 6.5. In the case of a standard laminate having a thickness of 1.6 mm, the above ratio is preferably about 5.0 to 6.0.

In the intermediate layer of the laminate of this invention, an inorganic filler is added to a thermosetting resin, thereby keeping and improving the punch processability and dimension stability and simultaneously diminishing the thermal expansion in the thickness direction (the Z direction), so that it is possible to improve the through hole reliability. Moreover, though the glass non-woven fabric has heretofore been used to constitute the whole intermediate layer, the disuse thereof makes it possible to greatly reduce the voids (the remaining bubbles) in the intermediate layer.

The inorganic filler to be used in the intermediate layer includes aluminum hydroxide, calcium carbonate, clay, talc, silica and the like, and the amount of the filler mixed is preferably 10 to 300% by weight based on the weight of the resin. When it is less than 10% by weight, the flow of the resin composition during lamination molding is large, and the effect on the improvement of through hole reliability is small, and when it exceeds 300% by weight, the mixing of the inorganic filler with the resin and the molding of laminate become difficult. The above amount is more preferably 50 to 200% by weight.

In this invention, it is preferable to incorporate an inorganic fiber together with the inorganic filler into the thermosetting resin in the intermediate layer in order to improve the flexural strength and impact resistance of the laminate. By incorporating the inorganic fiber, the flow of the resin composition during lamination molding can be inhibited. The inorganic fiber includes alumina fiber, glass fiber and the like, and the amount of the fiber incorporated is preferably 0.01 to 50% by weight based on the weight of the resin. When the amount is less than 0.01% by weight, the improvement effect on flexural strength and impact resistance is small, and when it exceeds 50% by weight, the incorporation of the inorganic fiber and the molding become difficult. The diameter of the inorganic fiber is preferably not more than 15 $\mu$m; however, it is more preferably not more than 7 $\mu$m in view of easiness of incorporation into the resin. When the diameter is more than 15 $\mu$m, the abrasion in processing the resulting laminate using a drill or the like is large, and the larger diameter causes breakage of a drill in some cases. The length of the inorganic fiber is usually not more than 6 mm, and when the length is more than 6 mm, the incorporation of the fiber into the resin becomes difficult. However, when the fiber diameter is 15 $\mu$m or less, it is easy to incorporate even a longer fiber into the resin, and even inorganic fibers having a length of at least about 20 mm can be used.

In this invention, the thermosetting resin to be used in the intermediate layer is preferably an epoxy resin; however, polyimide resins, polyester resins, phenol resins and the like can also be used. The thickness of the intermediate layer is varied depending upon the thickness of the final laminate and the thickness of the napped glass cloth in the surface layer. When the thickness of the intermediate layer is 0.1 mm or less, there is a possibility that the napped glass cloth need not be used (because the flow is small). The thickness of the intermediate layer is usually about 0.2 to 2.0 mm, and practically about 0.6 to 1.4 mm.

Furthermore, as the thermosetting resin to be used for impregnation of the napped glass cloth in the surface layer, an epoxy resin is also preferred; however, similarly to the intermediate layer, there can also be used polyimide resins, polyester resins, phenol resins and the like. Such a thermosetting resin varnish may be composed of the resin alone; however, tracking resistance can be imparted by adding thereto an inorganic filler such as aluminum hydroxide or the like.

In the laminate of this invention, a napped glass cloth is used in the surface layer and the intermediate layer is composed of an inorganic filler-containing thermosetting resin composition, and therefore, the flow of this resin composition can be inhibited during lamination molding and the adhesion properties between the surface layers and the intermediate layer are also excellent. Accordingly, in spite of the disuse of the glass non-woven fabric in the intermediate layer, the thickness precision of the laminate is very good, the punch processability and dimension stability are maintained and improved, and simultaneously, the thermal expansion in the thickness direction (the Z direction) is diminished, so that the through hole reliability can be improved. Moreover, by incorporating an inorganic fiber together with the inorganic filler into the intermediate layer, the flexural strength and impact resistance are increased. Accordingly, the performance of the laminate is maintained and improved and simultaneously it is made possible to increase the yield at the time of the lamination molding, whereby and by the disuse of an expensive glass non-woven fabric, it is made possible to achieve a low cost. Furthermore, it has been found that by making the nap long, the strength of the glass cloth is lowered and hence the napping is effective to improve the punch processability and the like.

An explanation is made below of the process for producing a laminate of this invention.

A typical production process comprises a step of coating a thermosetting resin containing an inorganic filler on the napped surface of a long continuous glass cloth napped on one or both sides and heating the same, a step of preparing a composite prepreg by piling a glass cloth napped on one or both sides on the above resin-coated surface so that the napped surface faces the resin-coated surface and a step of heating and pressing this composite prepreg. In this production process, the production steps are simple and continuous molding is possible. Preferably, the step of preparing the composite prepreg is followed by a step of coating a thermosetting resin on both surfaces of the above composite prepreg and heating the resin-coated composite prepreg. In the above manner, the laminate of this invention can be obtained.

The napped glass cloth used as the surface layer can be previously impregnated with a thermosetting resin. The conditions for heating and pressing may be equivalent to the usual molding conditions for a composite laminate; however, it is preferable to make the pressure somewhat lower than the usual pressure condition in order to inhibit the flow during lamination molding.

FIG. 1 shows a diagram of an example of the process for preparing a composite prepreg to be used for producing the laminate of this invention.

A long continuous glass cloth (1) napped on one or both sides is unwound and the napped surface thereof is coated with an inorganic filler-containing thermosetting resin varnish (2) by a coater (3) so that the coating film has the desired thickness. The solid content of this inorganic filler-containing varnish (2) is usually 65 to 95% by weight (the inorganic filler is also included in the solid content), and preferably 75 to 85% by weight.

As to dilution with a solvent, when the varnish before the dilution has a suitably low viscosity, it is preferable to use the solventless varnish undiluted with any solvent. The amount of the inorganic filler-containing varnish (2) coated is varied depending upon the kind of the resin used, the basis weight (weight per unit area) of the napped glass cloth and the like, and is usually about 500 to 1,600 g as the solid content per $m^2$ of the glass cloth, and the thickness of the coating film (after heating and drying) is about 0.2 to 2.0 mm.

The coater (3) includes a comma roll coater, a knife coater, a die coater, a reverse coater and the like. However, since the coating film is as thick as 0.2 to 2.0 mm, it is necessary to make the varnish viscosity high. Therefore, a means capable of applying a high viscosity varnish, for example, a comma roll coater or a knife coater is preferred.

Subsequently, the varnish-coated glass cloth is allowed to pass through a heating apparatus (4) to conduct the impregnation with the resin or both the impregnation with the resin and the evaporation of the solvent. The heating conditions are varied depending upon whether a solvent is used or not, the kind and amount of the solvent, and the like; however, the heating is usually effected at 80 to 160° C. for about 1 to 10 minutes. In the above manner, there is obtained a glass cloth coated with an inorganic filler-containing thermosetting resin.

Separately, a long continuous glass cloth (5) napped on one or both sides is unwound and piled on the above-mentioned glass cloth coated with an inorganic filler-containing resin in such a manner that the napped surface of the long continuous glass cloth (5) faces the resin-coated surface, to obtain a composite prepreg (6). This piling step is preferably effected at the time when the thermosetting resin containing the inorganic filler is melted by heat.

The composite prepreg (6) thus obtained is cut to the desired length and then heated and pressed, or is not cut but continuously heated and pressed as it is, to be molded into a laminate. In this molding, usually, a metal foil or foils is or are piled on one or both surfaces of the composite prepreg and then the resulting assembly is heated and pressed. In this heating and pressing, the molten thermosetting resin of the inorganic filler-containing thermosetting resin in the composite prepreg further permeates the glass cloth. Accordingly, it usually follows that in the laminate obtained, the thermosetting resin is present in a sufficient amount in the glass cloths constituting both surface layers of the laminate.

However, in the heating and pressing, in some cases, the thermosetting resin does not permeate sufficiently the glass cloths constituting both surface layers. In these cases, a thermosetting resin varnish (7) is coated on both outer surfaces of the composite prepreg (6) as described below. This coating is usually carried out by roll coaters (8) and (9) though these are not limitative. The thermosetting resin varnish coated is supplementary to the resin component of the inorganic filler-containing thermosetting resin which has not sufficiently permeated the napped glass cloth, and hence, the amount of the resin coated and impregnated may be small, and for uniform impregnation, a thermosetting resin varnish having a resin solid content of about 20 to 60% by weight is usually used. This thermosetting resin varnish (7) may contain an inorganic filler such as aluminum hydroxide, calcium carbonate or the like in order to improve the tracking resistance, and the amount of the inorganic filler is 100% by weight or less, preferably about 30 to 80% by weight, of the resin content.

Thereafter, the resulting assembly is heated by allowing it to pass through a heating apparatus (10), thereby obtaining a composite prepreg (11) in which the glass cloths in the surface layers have been impregnated with the thermosetting resin. The heating conditions are somewhat stronger conditions than usual, namely, at 120 to 180° C. for about 1 to 5 minutes because the total thickness of the composite prepreg is large. Subsequently, this composite prepreg (11) is cut to the desired length by a cutter (12). Alternatively, it is possible to subject the composite prepreg to continuous molding without cutting the same.

Incidentally, the napped long continuous glass cloth (1) can be previously impregnated with a thermosetting resin varnish before coating the glass cloth (1) with the inorganic filler-containing varnish (2) in order to improve the adhesion properties between the napped glass cloth (1) and the inorganic filler-containing varnish (2). Moreover, the other napped glass cloth (5) can be previously subjected to the same treatment (impregnation with a thermosetting resin varnish) before piling. Specifically, it is preferable to coat the napped surface of the napped glass cloth with the thermosetting resin varnish by a coater to the desired film thickness; however, such a usual impregnation method that the glass cloth is dipped in a resin varnish, may be used. The resin of the thermosetting resin varnish used in this case may be the same as used in the above-mentioned inorganic filler-containing varnish (2) and the above-mentioned thermosetting resin varnish (7).

The composite prepreg (11) thus obtained is molded by heating and pressing into a laminate. This molding is usually effected by heating and pressing one sheet of the prepreg cut to the desired length by means of a multi-stage pressing apparatus. However, it is possible to continuously heat and press a long continuous composite prepreg which has not been cut. In this molding, usually, a metal foil is piled on one or both surfaces of the composite prepreg and then the resulting assembly is molded. When the thermosetting resin is an epoxy resin, the former molding method is usually carried out. The molding conditions therefor are varied depending upon the fluidity of the resin composition which has been coated; however, usually, the molding is effected under the same pressure as or a lower pressure than in the case of the conventional composite laminate. That is to say, it is appropriate that the temperature is 150 to 180° C., the pressure is 20 to 70 kg/cm² and the period of time is 60 to 120 minutes.

The composite laminate can be produced by the above-mentioned process. In this invention, the napped glass cloth is coated with the inorganic filler-containing thermosetting resin varnish to the desired thickness and then heated, and thereafter, the same glass cloth as mentioned above is further piled thereon. Therefore, the coating and impregnating steps are simple even when the subsequent coating of the resin varnish on both surfaces of the resulting composite prepreg is taken into consideration. Furthermore, in the intermediate layer, a glass non-woven fabric which is relatively high in cost is unnecessary, and hence this invention is also advantageous in respect of cost. Furthermore, the disuse of this glass non-woven fabric makes it possible to prevent voids from being generated by the solvent, and the use of the napped glass cloth makes it possible to inhibit the flow during lamination molding, so that the moldability is good. Accordingly, the trouble during lamination molding is small and a low cost can be achieved.

As stated above, the laminate of this invention uses a napped glass cloth, and hence, the interlaminar adhesion properties between the surface layer and the intermediate layer are excellent. Moreover, the flow during lamination molding is small or substantially nil, so that the thickness precision of the laminate is excellent and the increase of yield in the lamination molding and the decrease of laminate cost can be achieved. Furthermore, the enhancement of flexural strength and impact resistance can be achieved by incorporating an inorganic fiber together with an inorganic filler into the intermediate layer resin.

Examples and Comparative Examples are shown below to illustrate this invention, in which "part" and "%" are by weight unless otherwise specified.

EXAMPLE 1

An epoxy resin varnish [1a] was prepared by uniformly mixing the following materials:

| | | |
|---|---|---|
| (1) | Brominated epoxy resin (Ep-1046, a trade name of Yuka-Shell) | 100 parts |
| (2) | Dicyandiamide | 4 parts |
| (3) | 2-Ethyl-4-methylimidazole | 0.15 part |
| (4) | Methyl Cellosolve | 30 parts |
| (5) | Acetone | 60 parts |

Subsequently, the following inorganic fillers were added to the epoxy resin varnish [1a] in the amounts shown below per 100 parts of the resin solid content and the resulting mixture was stirred to prepare an inorganic filler-containing varnish [2a]:

| | | |
|---|---|---|
| (1) | Silica (Crystalite VX-3, a trade name of Tatsumori) | 25 parts |
| (2) | Gypsite type Aluminum hydroxide (Hygilite H-42, a trade name of Showa Denko) | 70 parts |
| (3) | Ultrafine powder silica (Carplex, a trade name of Shionogi) | 5 parts |

Subsequently, a glass cloth having a basis weight of 210 g/m² (WE-18K RB-84, a trade name of NITTO BOSEKI) was unwound and napped on one side by raising fillets to a nap length of 600 to 800 μm, and the above varnish [2a] was applied by a knife coater to the napped surface so that the film thickness after drying became 1.4 mm and then heated and dried at 150° C. for 3 minutes in a heating apparatus. On the coating film was piled a glass cloth having a basis weight of 210 g/m² (WE-18K RB-84, a trade name of NITTO BOSEKI) napped on one side in the same manner as above so that the napped side faced the coating film. Subsequently, the above varnish [1a] was coated on both surfaces of the resulting assembly by a roll coater and then heated and dried at 150° C. for 3 minutes in a heating apparatus to obtain a composite prepreg. This prepreg was cut to the desired length (2 m) and a copper foil having a thickness of 18 μm was piled on each surface of the prepreg, after which the resulting assembly was subjected to lamination molding at a molding temperature of 165° C. at a pressure of 30 kg/cm² for 90 minutes, to obtain a copper-clad laminate having a thickness of 1.6 mm.

EXAMPLE 2

The epoxy resin varnish [1a] prepared in Example 1 was compounded with the following inorganic fillers in the amounts shown below per 100 parts of the resin solid content, and the resulting mixture was stirred to prepare an inorganic filler-containing varnish [2b]:

| | | |
|---|---|---|
| (1) | Silica (Crystalite VX-3, a trade name of Tatsumori) | 25 parts |
| (2) | Aluminum hydroxide (Hygilite H-42, a trade name of Showa Denko) | 70 parts |
| (3) | Ultrafine powder silica (Carplex, a trade name of Shionogi) | 5 parts |
| (4) | Alumina fiber (T/#5100, a trade name of NICHIAS) having a diameter of 2.5 μm and a length of 15 mm on average | 5 parts |

The same subsequent procedure as in Example 1 was repeated, except that the above inorganic filler-containing varnish [2b] was substituted for the varnish [2a], to prepare a copper-clad laminate having a thickness of 1.6 mm.

Comparative Example 1

The inorganic filler-containing varnish [2a] prepared in Example 1 was coated on one surface of an unnapped glass cloth having a basis weight of 210 g/m² (WE-18K RB-84, a trade name of NITTO BOSEKI) by a knife coater so that the thickness of coating film after drying became 1.4 mm, and then heated and dried at 150° C. for 3 minutes in a heating apparatus. On the resulting coating film was piled an unnapped glass cloth having a basis weight of 210 g/m² (WE-18K RB-84, a trade name of NITTO BOSEKI) in the same manner as in Example 1, and the epoxy resin varnish [1a] prepared in Example 1 was coated on each surface of the resulting assembly by a roll coater, and the assembly thus obtained was heated and dried at 150° C. for 3 minutes in a heating apparatus to obtain a composite prepreg. The composite prepreg obtained was subjected to the same subsequent procedure as in Example 1 to obtain a copper-clad laminate having a thickness of 1.6 mm.

Comparative Example 2

The same procedure as in Comparative Example 1 was repeated, except that the inorganic filler-containing varnish [2b] prepared in Example 2 was substituted for the inorganic filler-containing varnish [2a] prepared in Example 1, to obtain a copper-clad laminate having a thickness of 1.6 mm.

Comparative Example 3

Conventional Example

A glass non-woven fabric (EP4075, a trade name of JAPAN VILENE) was impregnated with the inorganic filler-containing varnish [2a] prepared in Example 1 so that the total amount of the resin and the inorganic fillers contained became 90% of the overall weight of the intermediate layer and then heated and dried at 150° C. for 3 minutes in a heating apparatus to obtain a glass non-woven fabric prepreg. Separately, an unnapped glass cloth (WE-18K RB-84, a trade name of NITTO BOSEKI) was impregnated with the epoxy resin varnish [1a] prepared in Example 1 so that the resin content became 40% and then heated and dried at 150° C. for 3 minutes in a heating apparatus to obtain a glass cloth prepreg. Subsequently, three sheets of the above glass non-woven fabric prepregs were piled one on another to prepare an intermediate layer, and the glass cloth prepreg obtained above was placed as the surface layer on each side of the intermediate layer. Moreover, a copper foil having a thickness of 18 μm was put on both surfaces of the resulting assembly, and the resulting assembly was subjected to lamination molding at a temperature of 165° C. at a pressure of 60 kg/cm² for 90 minutes to obtain a copper-clad laminate having a thickness of 1.6 mm.

EXAMPLE 3

An inorganic filler-containing epoxy resin varnish [2c] was prepared by uniformly mixing the following materials in the amounts shown below:

| | | |
|---|---|---|
| (1) | Brominated epoxy resin (Ep-1046, a trade name of Yuka-Shell) | 100 parts |
| (2) | Dicyandiamide | 4 parts |
| (3) | 2-Ethyl-4-methylimidazole | 0.15 part |
| (4) | Aluminum hydroxide (Hygilite H-42, a trade name of Showa Denko) | 80 parts |
| (5) | Ultrafine powder silica (Carplex, a trade name of Shionogi) | 20 parts |
| (6) | Methyl Cellosolve | 50 parts |

Subsequently, a glass cloth having a basis weight of 210 g/m$^2$ (WE-18K RB-84, a trade name of NITTO BOSEKI) was unwound and napped on one side by raising fillets to a nap length of 600 to 800 μm, and the above inorganic filler-containing resin varnish [2c] was applied by a knife coater to the napped surface so that the film thickness after drying became 1.4 mm and then heated and dried at 150° C. for 3 minutes in a heating apparatus. On the resulting coating film was piled a glass cloth having a basis weight of 210 g/m$^2$ (WE-18K RB-84, a trade name of NITTO BOSEKI) napped on one side so that the napped surface faced the coating film. Thereafter, an epoxy resin varnish [3a] having the following composition was coated by roll coaters on both surfaces of the resulting assembly, and the resulting assembly was heated and dried at 160° C. for 3 minutes in a heating apparatus to obtain a composite prepreg:

The composition of the varnish [3a]:

| | | |
|---|---|---|
| (1) | Brominated epoxy resin (Ep-1046, a trade name of Yuka-Shell) | 80 parts |
| (2) | Novolak type epoxy resin (E-180, a trade name of Yuka-Shell) | 20 parts |
| (3) | Dicyandiamide | 4 parts |
| (4) | 2-Ethyl-4-methylimidazole | 0.15 part |
| (5) | Methyl Cellosolve | 200 parts |

The above prepreg was cut to the desired length (2 m) and then a copper foil having a thickness of 18 μm was piled on the upper and lower surfaces of the prepreg, after which the resulting assembly was heated and pressed at a temperature of 165° C. at a pressure of 20 kg/cm$^2$ for 90 minutes to obtain a copper-clad laminate having a thickness of 1.6 mm.

EXAMPLE 4

The same procedure as in Example 3 was repeated, except that the following inorganic filler-containing varnish [2d] was substituted for the inorganic filler-containing varnish [2c] prepared in Example 3 to prepare a copper-clad laminate having a thickness of 1.6 mm:

The composition of the varnish [2d]:

| | | |
|---|---|---|
| (1) | Brominated epoxy resin (Ep-1046, a trade name of Yuka-Shell) | 80 parts |
| (2) | Novolak type epoxy resin (E-180, a trade name of Yuka-Shell) | 20 parts |
| (3) | Dicyandiamide | 4 parts |
| (4) | 2-Ethyl-4-methylimidazole | 0.15 part |
| (5) | Aluminum hydroxide (Hygilite H-42, a trade name of Showa Denko) | 80 parts |
| (6) | Ultrafine powder silica (Carplex, a trade name of Shionogi) | 20 parts |
| (7) | Alumina fiber (T/#5100, a trade name of NICHIAS) having a diameter of 2.5 μm and a length of 15 mm on average | 5 parts |
| (8) | Methyl Cellosolve | 50 parts |

EXAMPLE 5

An epoxy resin varnish [1b] was prepared by uniformly mixing the following materials in the amounts shown below:

| | | |
|---|---|---|
| (1) | Brominated epoxy resin (Ep-1046, a trade name of Yuka-Shell) | 80 parts |
| (2) | Novolak type epoxy resin (E-180, a trade name of Yuka-Shell) | 20 parts |
| (3) | Dicyandiamide | 4 parts |
| (4) | 2-Ethyl-4-methylimidazole | 0.15 part |
| (5) | Methyl Cellosolve | 30 parts |
| (6) | Acetone | 60 parts |

An inorganic filler-containing epoxy resin varnish [2e] was prepared by stirring and mixing the following materials in the amounts shown below:

| | | |
|---|---|---|
| (1) | Brominated epoxy resin (Ep-1046, a trade name of Yuka-Shell) | 60 parts |
| (2) | Novolak type epoxy resin (E-180, a trade name of Yuka-Shell) | 40 parts |
| (3) | Dicyandiamide | 4 parts |
| (4) | 2-Ethyl-4-methylimidazole | 0.15 part |
| (5) | Aluminum hydroxide (Higilite H-42, a trade name of Showa Denko) | 110 parts |
| (6) | Silica (Crystalite VX-3, a trade name of Tatsumori) | 20 parts |
| (7) | Ultrafine powder silica (Carplex, a trade name of Shionogi) | 20 parts |
| (8) | Methyl Cellosolve | 50 parts |

Subsequently, a glass cloth having a basis weight of 210 g/m$^2$ (WE-18K RB-84, a trade name of NITTO BOSEKI) was unwound and napped on one side by raising fillets to a nap length of 600 to 800 μm, and the above varnish [2e] was applied by a knife coater to the napped surface so that the film thickness after drying became 1.4 mm and then heated and dried at 150° C. for 3 minutes in a heating apparatus. On the resulting coating film was piled a glass cloth having a basis weight of 210 g/m$^2$ (WE-18K RB-84, a trade name of NITTO BOSEKI) napped on one side so that the napped surface faced the coating film. Thereafter, the above varnish [1b] was coated by a roll coater on each of both surfaces of the resulting assembly, and the resulting assembly was heated and dried at 150° C. for 3 minutes in a heating apparatus to obtain a composite prepreg. This prepreg was cut to the desired length (2 m) and a copper foil having a thickness of 18 μm was piled on both surfaces of the prepreg, and thereafter, the resulting assembly was subjected to lamination molding at a molding temperature of 165° C. at a pressure of 30 kg/cm$^2$ for 90 minutes to obtain a copper-clad laminate having a thickness of 1.6 mm.

EXAMPLE 6

The same procedure as in Example 5 was repeated, except that the inorganic filler-containing epoxy resin varnish [2f]

prepared using the following materials in the amounts shown below was substituted for the varnish [2e], to obtain a copper-clad laminate having a thickness of 1.6 mm:

| | | |
|---|---|---|
| (1) | Brominated epoxy resin (Ep-1046, a trade name of Yuka-Shell) | 60 parts |
| (2) | Novolak type epoxy resin (E-180, a trade name of Yuka-Shell) | 40 parts |
| (3) | Dicyandiamide | 4 parts |
| (4) | 2-Ethyl-4-methylimidazole | 0.1 part |
| (5) | Aluminum hydroxide (Higilite H-42, a trade name of Showa Denko) | 110 parts |
| (6) | Silica (Crystalite VX-3, a trade name of Tatsumori) | 10 parts |
| (7) | Alumina fiber (T/#5100, a trade name of NICHIAS) having a diameter of 2.5 μm and a length of 15 mm on average) | 10 parts |
| (8) | Ultrafine powder silica (Carplex, a trade name of Shionogi) | 20 parts |
| (9) | Methyl Cellosolve | 50 parts |

EXAMPLES 7 and 8

In Examples 5 and 6, the napped surface of the napped glass cloth to be coated with the inorganic filler-containing varnish was previously coated with the following epoxy resin varnish [4] by a knife coater so that the thickness (before heating) became 0.2 mm and subsequently, in the same manner as in Examples 5 and 6, copper-clad laminates each having a thickness of 1.6 mm were obtained:

The composition of the varnish [4]:

| | | |
|---|---|---|
| (1) | Brominated epoxy resin (Ep-1046, a trade name of Yuka-Shell) | 80 parts |
| (2) | Novolak type epoxy resin (E-180, a trade name of Yuka-Shell) | 20 parts |
| (3) | Dicyandiamide | 4 parts |
| (4) | 2-Ethyl-4-methylimidazole | 0.1 part |
| (5) | Methyl Cellosolve | 50 parts |

Comparative Example 4

One surface of an unnapped glass cloth having a basis weight of 210 g/m² (WE-18K RB-84, a trade name of NITTO BOSEKI) was coated with the inorganic filler-containing varnish [2e] prepared in Example 5 by a knife coater so that the film thickness after heating became 1.4 mm and then heated and dried at 150° C. for 3 minutes in a heating apparatus. On the resulting coating film was piled an unnapped glass cloth having a basis weight of 210 g/m² (WE-18K RB-84, a trade name of NITTO BOSEKI) and thereafter, the epoxy resin varnish [1b] prepared in Example 5 was coated on both surfaces of the resulting assembly by roll coaters and then heated and dried at 150° C. for 3 minutes in a heating apparatus to obtain a composite prepreg. The composite prepreg was subjected to the same subsequent procedure as in Example 1, to obtain a copper-clad laminate having a thickness of 1.6 mm.

Comparative Example 5

The same procedure as in Comparative Example 4 was repeated, except that the inorganic filler-containing varnish [2f] prepared in Example 6 was substituted for the inorganic filler-containing varnish [2e] prepared in Example 5, to obtain a copper-clad laminate having a thickness of 1.6 mm.

Comparative Example 6

Conventional Example

An inorganic filler-containing epoxy resin varnish [2g] was prepared using the following materials in the amounts shown below:

| | | |
|---|---|---|
| (1) | Brominated epoxy resin (Ep-1046, a trade name of Yuka-Shell) | 80 parts |
| (2) | Novolak type epoxy resin (E-180, a trade name of Yuka-Shell) | 20 parts |
| (3) | Dicyandiamide | 4 parts |
| (4) | 2-Ethyl-4-methylimidazole | 0.1 part |
| (5) | Aluminum hydroxide (Higilite H-42, a trade name of Showa Denko) | 70 parts |
| (6) | Silica (Crystalite VX-3, a trade name of Tatsumori) | 10 parts |
| (7) | Ultrafine powder silica (Carplex, a trade name of Shionogi) | 20 parts |
| (8) | Methyl Cellosolve | 50 parts |

A glass non-woven fabric (EP4075, a trade name of JAPAN VILENE) was impregnated with the above inorganic filler-containing varnish [2g] so that the total amount of the resin and the inorganic filler became 90% of the overall weight of the intermediate layer, and then heated and dried at 150° C. for 3 minutes in a heating apparatus to obtain a glass non-woven fabric prepreg. Separately, an unnapped glass cloth (WE-18K RB-84, a trade name of NITTO BOSEKI) was impregnated with the epoxy resin varnish [1b] prepared in Example 5 so that the resin content became 40%, and then heated and dried at 150° C. for 3 minutes in a heating apparatus to obtain a glass cloth prepreg. Three sheets of the above glass non-woven fabric prepregs were piled one on another to form an intermediate layer, and the above glass cloth prepreg was placed on both surfaces of the intermediate layer, after which a copper foil having a thickness of 18 μm was put on both surfaces of the resulting assembly, and the resulting assembly was subjected to lamination molding at a molding temperature of 165° C. at a pressure of 60 kg/cm² for 90 minutes to obtain a copper-clad laminate having a thickness of 1.6 mm.

The copper-clad laminates obtained in the above Examples and Comparative Examples were subjected to measurement of flow during lamination molding, interlaminar peeling strength (interlaminar adhesion property), flexural strength, falling ball impact test (impact resistance), soldering heat resistance, punch processability, thickness precision and thermal expansion coefficient in the Z direction. The results obtained are shown in Table 1.

<Measurement Method>

1. Flow During Lamination Molding

When a laminate having a size of 500×500 mm was formed from a composite prepreg, the maximum flow length of the resin flowing out of the edge face of the prepreg was determined.

2. Interlaminar Peeling Strength

The copper foil was removed by etching and thereafter the laminate was cut to a width of 10 mm and the bonding strength between the surface layer and the intermediate layer was determined by a tensile tester.

3. Flexural Strength (Longitudinal Direction)

Determined according to JIS-C6481.

4. Falling Ball Impact Test

An iron ball of 250 g was allowed to fall on the laminate and the height at which the laminate was broken was determined.

5. Soldering Heat Resistance

A test piece of the copper-clad laminate having a shape of 25-mm square was allowed to float on a solder bath at 260° C. and the time required until the test piece was blistered was determined.

6. Punch Processability

Determined according to ASTM D617.

E: Excellent

G: Good

VG: Very good.

7. Thickness Precision

The thicknesses at a point in each corner (4 points in total), at a point in the middle portion of each side (4 points in total) and at a point in the center portion of a copper-clad laminate having a shape of 1000-mm square were determined by a micrometer and the variation was calculated by the following formula:

[(maximum value measured−minimum value measured)/average value]×100 (%).

8. Thermal expansion coefficient in Z direction

When the laminate was heated from 50° C. to 200° C., the expansion coefficient of the laminate in the Z direction was determined (according to TMA).

What is claimed is:

1. A laminate, comprising:

two surface layers, both of which are comprised of a base material of a glass cloth napped at least on its inner surface side and impregnated with a thermosetting resin, and an intermediate layer, of a composition consisting essentially of a thermosetting resin mixed with an inorganic filler in a proportion of 10 to 300% by weight based on the weight of the resin, wherein the surface layers and the intermediate layer are integrated by heating and pressing, and wherein the weight ratio of the total amount of the resin and the inorganic filler to the amount of the glass cloth contained in the whole laminate is 2.0 to 10.0.

2. The laminate according to claim 1, wherein the nap length of the napped glass cloth is 50 μm or more.

3. The laminate according to claim 1, wherein the thickness of the intermediate layer is 0.2 to 2.0 mm.

4. The laminate according to claim 1, wherein the composition of the intermediate layer comprises as a part of the inorganic filler an inorganic fiber in a proportion of 0.01 to 50% by weight based on the weight of the thermosetting resin, and wherein the weight ratio of the total amount of the resin and the inorganic filler to the amount of the glass cloth contained in the whole laminate is 2.0 to 10.0.

TABLE 1

| Item | | Example 1 | Example 2 | Comp. Example 1 | Comp. Example 2 | Comp. Example 3 | Example 3 | Example 4 |
|---|---|---|---|---|---|---|---|---|
| Flow during lamination molding | mm | 5 | 4 | 100 | 100 | 5 | 4 | 4 |
| Interlaminer peeling strength | kg | 1.8 | 2.0 | 0.5 | 0.5 | 2.0 | 2.0 | 2.2 |
| Flexural strength (longitudinal direction) | N/mm² | 360 | 400 | 300 | 320 | 400 | 400 | 420 |
| Falling ball impact test | cm | 30 or more | 30 or more | 20 | 25 | 30 or more | 30 or more | 30 or more |
| Soldering heat resistance | sec | 120 or more | 120 or more | 30 | 30 | 120 or more | 120 or more | 120 or more |
| Punch processability | Surface | point | E | E | G | G | VG | E | E |
| | Edge face | point | E | E | G | G | VG | E | E |
| Thickness precision | % | 10 | 8 | 25 | 25 | 10 | 10 | 8 |
| Thermal expansion coefficient in Z direction | % | 3.8 | 3.7 | 3.8 | 3.7 | 3.7 | 3.7 | 3.7 |

| Item | | Example 5 | Example 6 | Example 7 | Example 8 | Comp. Example 4 | Comp. Example 5 | Comp. Example 6 |
|---|---|---|---|---|---|---|---|---|
| Flow during lamination molding | mm | 5 | 4 | 5 | 4 | 95 | 80 | 4 |
| Interlaminer peeling strength | kg | 2.0 | 2.2 | 2.1 | 2.3 | 0.6 | 0.7 | 2.0 |
| Flexural strength (longitudinal direction) | N/mm² | 360 | 400 | 380 | 410 | 300 | 320 | 400 |
| Falling ball impact test | cm | 30 or more | 30 or more | 30 or more | 30 or more | 20 | 25 | 30 or more |
| Soldering heat resistance | sec | 120 or more | 120 or more | 120 or more | 120 or more | 30 | 30 | 120 or more |
| Punch processability | Surface | point | E | E | E | E | G | G | VG |
| | Edge face | point | E | E | E | E | G | G | VG |
| Thickness precision | % | 10 | 8 | 10 | 8 | 20 | 25 | 10 |
| Thermal expansion coefficient in Z direction | % | 3.5 | 3.5 | 3.5 | 3.5 | 3.5 | 3.5 | 3.7 |

5. The laminate according to claim 4, wherein the inorganic fiber mixed with the resin in the intermediate layer has a diameter of 15 µm or less.

6. The laminate according to claim 4, wherein the nap length of the napped glass cloth is 50 µm or more.

7. The laminate according to claim 4, wherein the thickness of the intermediate layer is 0.2 to 2.0 mm.

8. A process for producing the laminate according to claim 1, which comprises:

coating a napped surface of a long continuous glass cloth napped on at least an inner surface with a thermosetting resin containing an inorganic filler and heating the same, piling a glass cloth napped on one or both sides on the above resin-coated surface so that the napped surface of the napped glass cloth faces the resin-coated surface to prepare a composite prepreg, and integrating the composite prepreg by heating and pressing.

9. The process for producing a laminate according to claim 8, wherein the step of preparing a composite prepreg is followed by a step of coating both surfaces of the composite prepreg with a thermosetting resin and heating the coated prepreg.

* * * * *